(12) United States Patent
De Jager

(10) Patent No.: US 11,448,971 B2
(45) Date of Patent: Sep. 20, 2022

(54) OPTICAL MASKLESS

(71) Applicant: ASML NETHERLANDS B.V., Veldhoven (NL)

(72) Inventor: Pieter Willem Herman De Jager, Middelbeers (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/258,559

(22) PCT Filed: Jul. 3, 2019

(86) PCT No.: PCT/EP2019/067862
§ 371 (c)(1),
(2) Date: Jan. 7, 2021

(87) PCT Pub. No.: WO2020/025246
PCT Pub. Date: Feb. 6, 2020

(65) Prior Publication Data
US 2021/0157245 A1 May 27, 2021

(30) Foreign Application Priority Data
Aug. 1, 2018 (EP) .................................... 18186826

(51) Int. Cl.
*G03F 7/20* (2006.01)
(52) U.S. Cl.
CPC ...... *G03F 7/70391* (2013.01); *G03F 7/70525* (2013.01)

(58) Field of Classification Search
CPC ............ G03F 7/70391; G03F 7/70525; G03F 7/70275
See application file for complete search history.

(56) References Cited

U.S. PATENT DOCUMENTS

| 5,691,541 | A | 11/1997 | Ceglio et al. |
| 6,046,792 | A | 4/2000 | Van Der Werf et al. |
| 2003/0179352 | A1* | 9/2003 | Van Der Mast .... G03F 7/70283 355/53 |
| 2005/0012916 | A1 | 1/2005 | Van Der Mast et al. |
| 2005/0094245 | A1* | 5/2005 | Cebuhar ............ G03F 7/70558 359/291 |
| 2006/0087635 | A1 | 4/2006 | Kazumi et al. |
| 2006/0132750 | A1* | 6/2006 | Gui .................... G03F 7/70308 355/69 |

(Continued)

OTHER PUBLICATIONS

International Search Report and Written Opinion issued in corresponding PCT Patent Application No. PCT/EP2019/067862, dated Aug. 19, 2019.

(Continued)

*Primary Examiner* — Steven Whitesell Gordon
(74) *Attorney, Agent, or Firm* — Pillsbury Winthrop Shaw Pittman LLP

(57) ABSTRACT

A method includes illuminating a mirror array with light having light amplitudes forming a first greyscale pattern, the mirror array including a number of mirrors and at least two of the mirrors are illuminated with a same amplitude of the light. The method also includes imaging the light with the light amplitudes onto a substrate to create a second greyscale pattern, different than the first greyscale pattern, at the substrate.

20 Claims, 11 Drawing Sheets

(56) References Cited

U.S. PATENT DOCUMENTS

2016/0085156 A1* 3/2016 Markle ................ G03F 7/2022
                                                        430/322

OTHER PUBLICATIONS

European Search Report issued in corresponding European Patent Application No. 18186826, dated Feb. 7, 2019.
Taiwanese Office Action issued in corresponding Taiwanese Patent Application No. 108126157, dated Feb. 27, 2020.

* cited by examiner

OPTICAL MASKLESS

CROSS-REFERENCE TO RELATED APPLICATIONS

This application is the U.S. national phase entry of PCT patent application no. PCT/EP2019/067862, which was filed on Jul. 3, 2019, which claims the benefit of priority of European patent application no. 18186826.6, which was filed on Aug. 1, 2018 and which is incorporated herein in its entirety by reference.

TECHNICAL FIELD

The description herein relates generally to patterning processes. More particularly, the disclosure includes apparatuses, methods, and computer program products for a performing maskless lithography.

BACKGROUND

A lithographic projection apparatus can be used, for example, in the manufacture of integrated circuits (ICs). A pattern corresponding to an individual layer of the IC ("design layout") can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus may also be referred to as a stepper. In an alternative apparatus, a step-and-scan apparatus can cause a projection beam to scan over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices, and 2D and/or 3D additive manufacturing.

As semiconductor manufacturing processes continue to advance, the dimensions of functional elements have continually been reduced while the amount of functional elements, such as transistors, per device has been steadily increasing over decades, following a trend referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is can be referred to as low-k1 lithography, according to the resolution formula $CD = k_1 \times \lambda / NA$, where $\lambda$ is the wavelength of radiation employed (e.g., 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

Methods, systems, and computer programs for performing maskless lithography are disclosed. In one aspect, the method includes illuminating a mirror array with light having light amplitudes forming a first greyscale pattern, the mirror array including a number of mirrors and at least two of the mirrors are illuminated with a same amplitude of the light. The method also includes imaging the light with the light amplitudes onto a substrate to create a second greyscale pattern, different than the first greyscale pattern, at the substrate.

In some variations, the method can include transmitting the light through an amplitude plate containing portions that cause the transmitted light to contain the light amplitudes. In other variations, the same amplitude of the light can be imaged onto the mirror array from a single portion of the amplitude plate. The first greyscale pattern can have a first resolution and the amplitude plate can transmit the light amplitudes to cause a combined exposure at the substrate to have a second resolution higher than the first resolution. The second resolution can have 256 greyscale values and the amplitude plate can transmit eight light amplitudes to give the first resolution eight greyscale values.

In other variations, the light amplitudes can correspond to bits in the first greyscale pattern. The method can include generating the first greyscale pattern having seven or eight light amplitudes. The first greyscale pattern having seven light amplitudes can be generated by illuminating eight portions of an amplitude plate where three of the eight portions transmit equal light amplitudes.

In some variations, a maskless lithography system can include multiple light sources configured to generate light having multiple light amplitudes. The light can then form a greyscale pattern at a mirror array configured to direct the light with the first greyscale pattern to a substrate. For example, in some embodiments, the light sources can correspond to one bit in the first greyscale pattern. In this way, illumination that forms the greyscale pattern can be done with multiple light sources. For example, a light source can generate one bit of the greyscale pattern. Optionally, each bit in the greyscale pattern can be generated with a single corresponding light source from the multiple light sources.

In yet other variations, the method can include toggling the light source on and off with a toggle frequency corresponding to an adjustment frequency of the mirror array. Also, one or more laser diodes can be controlled to emit the light. The light source can be positioned adjacent to the mirror array to form part of a staggered pattern of alternating light sources and mirror arrays. The light source can be positioned adjacent to a lens array to form part of a staggered pattern of alternating light sources and lens arrays.

In some variations, regions on the mirror array can be illuminated with the light amplitudes, and the regions can correspond to bits of the first greyscale pattern.

In other variations, the method can include imaging the light onto a lens array that includes a number of lenses that focus the light onto the substrate. The method can also include illuminating the substrate multiple times at a location to cause a total light amplitude delivered to correspond to the second greyscale pattern.

In yet other variations, the method can include positioning a lens array at an angle relative to a scan direction of the substrate such that spots from the lens array are substantially abutting to create a substantially continuous row of spots at the substrate.

In some variations, the method can include imaging, from the light, a Gaussian light beam onto a spot at the substrate, wherein the spot has a spot diameter that corresponds to a width of a profile of the Gaussian light beam. Also, the method can include delivering, during a scan of the substrate by a lithography system, exposures of the light to form a light feature having a light feature size and a light feature placement at the substrate, the light feature size based on the summation of amplitude profiles delivered during the exposures. The light feature can be shifted by modifying one or more of the light amplitudes in the exposures while maintaining the light feature size. The light feature can be formed by the summation of the light amplitudes corresponding to bits of the second greyscale pattern, and the shifting can be performed by changing the one or more of the light amplitudes to different bits in the second greyscale pattern.

In an interrelated aspect, a computer program product comprising a non-transitory computer readable medium having instructions recorded thereon, the instructions when executed by a computer implementing a method as described herein.

In yet another interrelated aspect, a maskless lithography system includes an amplitude plate that transmits light received from a light source, the amplitude plate including portions that cause the transmitted light to contain a number of light amplitudes. The system also includes a mirror array configured to direct the transmitted light to a substrate.

In some variations, the system can include a lens array that focuses the light onto spots on the substrate. The lens array can be a micro-lens array. The system can also include a light source that illuminates the amplitude plate, and can also uniformly illuminate the amplitude plate. The mirror array can be a digital mirror device.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

As used herein, the term "substrate" describes a material that light can be directed to as part of a manufacturing process. For example, substrate can include a photoresist, wafer, flat panel display, slurry with photo-sensitive material and particles of (e.g., metal or other functional material), etc.

As used herein, the term "patterning process" means a process that creates an etched substrate by the application of specified patterns of light as part of a lithography process. A patterning process can also include any process involving the delivery of light in manufacturing, for example in the development of flat screen devices or integrated circuits.

One or more embodiments of a maskless lithographic system and apparatus, a maskless lithographic method, a programmable patterning device and other apparatuses, articles of manufacture and methods are described herein. In an embodiment, a low cost and/or flexible maskless lithographic apparatus is provided. As it is maskless, no conventional mask is needed to expose, for example, ICs or flat panel displays. Similarly, one or more rings are not needed for packaging applications; the programmable patterning device can provide digital edge-processing "rings" for packaging applications to avoid edge projection. Maskless (digital patterning) can also enable patterning on a flexible substrate. As described herein, various embodiments allow successive exposures of "low resolution" greyscale light to combine to provide "high-resolution" greyscale images at a substrate to effect a patterning process.

Figure 1:
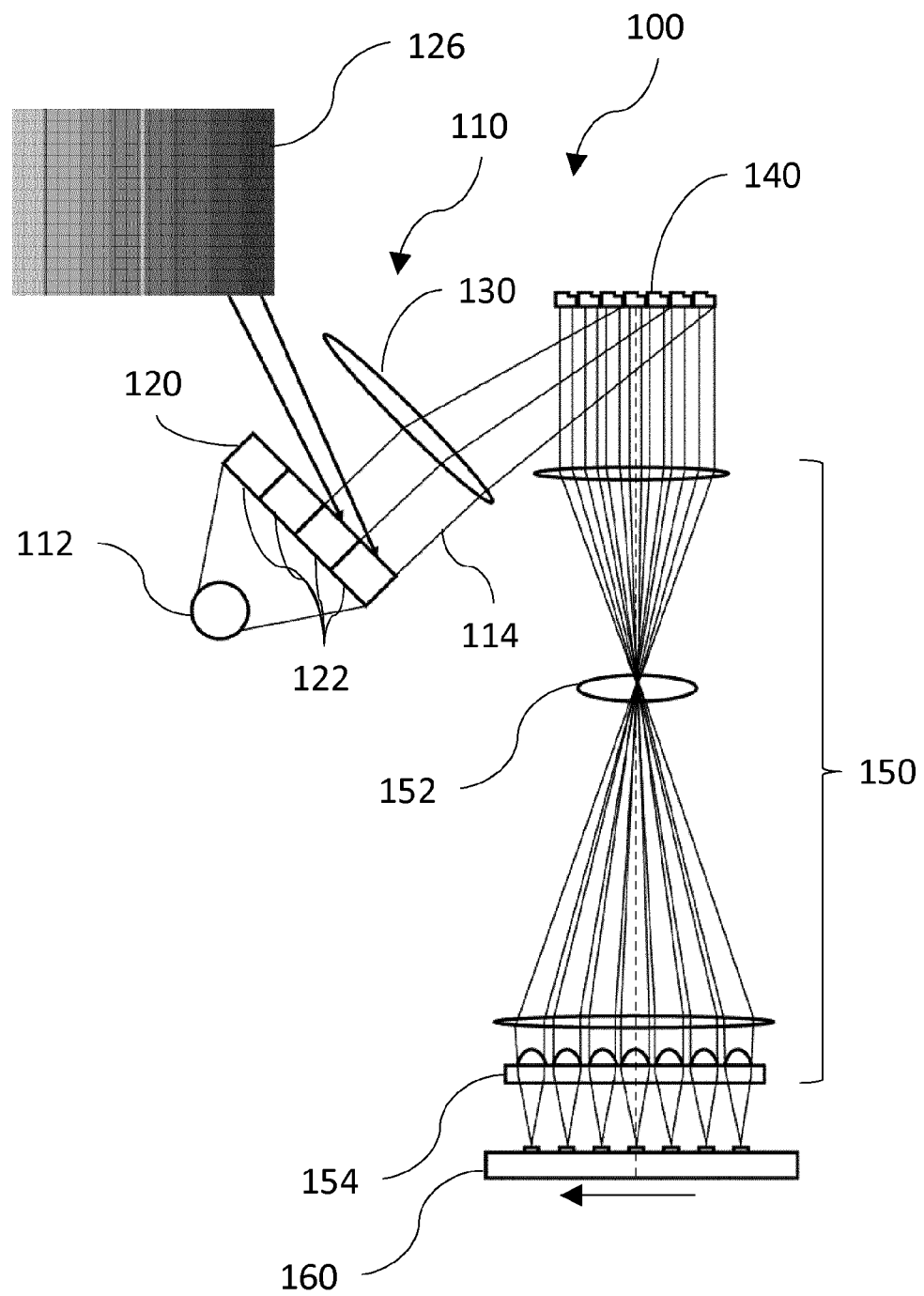
FIG. 1 is a simplified diagram illustrating an exemplary maskless lithography system, according to an embodiment.

FIG. 1 is a simplified diagram illustrating an exemplary maskless lithography system, according to an embodiment. As shown in FIG. 1, lithographic apparatus 100 can include a patterning device 110 and a projection system 150. Patterning device 110 can include light source 112 (such as a laser diode as discussed herein) and a mirror array 140. Mirror array 140 can receive light (also referred to herein as radiation beam or beam 114) from light source 112 and cause beam 114 to laterally displace in the X- and/or Y-directions. In an embodiment, the patterning device 110 may include lens 130 to image the radiation beam 114 from the light source 112 to mirror array 140.

The deflected beam 114 from mirror array 140 can be received by projection system 150. Projection system 150 can include objective lens 152, lens array 154, and any number of other lenses or lens arrays for performing focusing, magnification, aberration correction, etc. Objective lens 152 can be arranged to receive the beam 114 from patterning device 110. In the example of FIG. 1, beam 114 diverges from objective lens 152 and is received by lens array 154, which can include any number of individual lenses. Lens array 154 can then focus beam 114 onto substrate 160. As described further herein, substrate 160 can move relative to lithographic apparatus 100 as illustrated by the arrow.

By controlling the amplitude of light imaged onto specific locations of substrate 160, maskless lithography can be performed, as well as methods incorporating greyscaling (described in further detail below) that provide benefits to the lithography process. Accordingly, in an embodiment, a method of performing maskless lithography can include illuminating mirror array 140 with beam 114 having a number of light amplitudes forming first greyscale pattern 126. Mirror array 140 can include a number of mirrors that receive the light (e.g., having first greyscale pattern 126) from amplitude plate 120. The light having the number of light amplitudes can be imaged onto substrate 160 to create a second greyscale pattern, different than first greyscale pattern 126, at substrate 160. Also, at least two of the mirrors can be illuminated with a same amplitude of the light, which can act to form greyscale bands of illumination on mirror array 140, as described further herein.

As used herein, "first greyscale pattern" means the greyscale pattern produced at the mirror array 140, for example by amplitude plate 120, or other elements of lithographic apparatus 100. "Second greyscale pattern" means an effective greyscale pattern that results from one or more exposures of substrate 160 to first greyscale pattern 126. For example, exposing substrate 160 with light corresponding to the ½ amplitude of light source 112, and later exposing the same portion of substrate to the 1/256 amplitude of light source 112, this effectively creates a 129/256 amplitude of light source exposure at substrate 160.

In an embodiment, there can be a single light source 112 for mirror array 140. In other embodiments, light source 112 can comprise multiple light sources (e.g., 2, 3, 6, 10, etc.) that are combined to provide a uniform illumination of amplitude plate 120 (described further below).

In an embodiment, light source 112 can be toggled on and off with a toggle frequency corresponding to an adjustment frequency of mirror array 140. For example, if mirror array 140 is able to change its configuration 30 times a second (e.g., 1/60 second stationary and 1/60 second for adjustment), then light source 112 can be operated to turn on and off such that mirror array 140 is not illuminated during its 1/60 second adjustment period. In another embodiment, one or more laser diodes can act as light source 112 and can be controlled to emit the light, for example at the toggle frequency or pattern, or continuously.

In another embodiment, a maskless lithography system can include multiple light sources (illustrated collectively in FIG. 1 as light source 112) configured to generate light having multiple light amplitudes. The light can then form a greyscale pattern at a mirror array configured to direct the light with the first greyscale pattern to a substrate. For example, in some embodiments, the light sources can correspond to one bit in the first greyscale pattern. In this way, illumination that forms the greyscale pattern can be done with multiple light sources. For example, a light source can generate one bit of the greyscale pattern. In such an embodiment, the light source 112 may be an array of light sources, such as a two dimensional array, which may replace the amplitude plate 120. Optionally, each bit in the greyscale pattern can be generated with a single corresponding light source from the multiple light sources. For example, when the greyscale pattern is an eight-bit pattern, there can be multiple light sources (e.g., eight) that each generate a single amplitude of light. Similarly, in other embodiments, a bit can be formed by illumination from multiple light sources combining to form the desired amplitude corresponding to that bit (e.g., two light sources combining to form a first bit, another two light sources combining to form a second bit, etc.). In an alternative embodiment, each of the light sources in the array of light sources 120 generates a specific amplitude such that together they form the first greyscale pattern 126 which subsequently is projected onto the mirror array 140 to generate the second greyscale pattern. In such an embodiment, the amplitude of the individual light sources in the array of light sources may be adjusted for each pulse, thus generating a sequence of different first greyscale patterns 126 onto the mirror array 140, for example corresponding to the adjustment frequency of mirror array 140. In such an embodiment, a drive signal to the individual light sources (not shown) in the array of light sources 120 may be calibrated such that a well-defined sequence of greyscale values is generated in the first greyscale pattern 126.

In an alternative embodiment, the first greyscale pattern 126 may be a time-varying greyscale pattern. In such an embodiment, the beam 114 illuminating the mirror array 140 comprises a time-varying greyscale in which, e.g. the first pulse represents an amplitude of the most significant bit and a second pulse represents the amplitude of the next significant bit, etc, until the pulse representing the least significant bit. In such time-varying greyscale pattern, the light source 112 may illuminate the mirror array 140 uniformly at each of the different pulses during the time-varying operation. For such embodiment, the amplitude plate 120 may be omitted and the drive signal to the light source 112 is configured to generate the time-varying greyscale values to generate the time-varying first greyscale pattern 126.

Optionally, the lithographic apparatus can comprise a radiation system (not shown) to supply radiation (e.g., ultraviolet (UV) radiation) to the plurality of light sources 112. If the patterning device is a radiation source itself, e.g. a laser diode array or a LED array, the lithographic apparatus can be designed without a radiation system, i.e. without a radiation source other than the patterning device itself, or at least a simplified radiation system.

The radiation system can include an illumination system (illuminator) configured to receive radiation from a radiation source. The illumination system can include one or more of the following elements: a radiation delivery system (e.g., suitable directing mirrors), a radiation conditioning device (e.g., a beam expander), an adjusting device to set the angular amplitude distribution of the radiation (generally, at least the outer and/or inner radial extent (which can be referred to as σ-outer and σ-inner, respectively) of the amplitude distribution in a pupil plane of the illuminator can be adjusted), an integrator, or a condenser. The illumination system can be used to condition the radiation provided to light sources 112 to have a desired uniformity and amplitude distribution in its cross-section. The illumination system can be arranged to divide radiation into sub-beams that can, for example, each be associated with one or more of the plurality of light sources 112. A two-dimensional diffraction grating can, for example, be used to divide the radiation into sub-beams. In the present description, the terms "beam of radiation," "radiation beam," and "beam" encompass, but are not limited to, the situation in which beam 114 is comprised of a plurality of such sub-beams of radiation.

In other embodiments, the radiation system can also include a radiation source (e.g., an excimer laser) to produce the radiation for supply to or by light source 112. The radiation source and the lithographic apparatus 100 can be separate entities, for example when the radiation source is an excimer laser. In such cases, the radiation source is not considered to form part of the lithographic apparatus 100 and the radiation is passed from the source to the illuminator. In other cases the radiation source can be an integral part of the lithographic apparatus 100, for example when the source is a mercury lamp. Both of these scenarios are contemplated within the scope of the present invention.

In an embodiment, the radiation source, which in an embodiment can be light source 112, can provide radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In an embodiment, the radiation has a wavelength of at most 450 nm, e.g. at most 425 nm, at most 375 nm, at most 360 nm, at most 325 nm, at most 275 nm, at most 250 nm, at most 225 nm, at most 200 nm, or at most 175 nm. In an embodiment, the radiation can have a wavelength including 436 nm, 405 nm, 365 nm, 355 nm, 248 nm, 193 nm, 157 nm, 126 nm, and/or 13.5 nm. In an embodiment, the radiation can include a wavelength of around 365 nm or around 355 nm. In an embodiment, the radiation can include a broad band of wavelengths, for example encompassing 365 nm, 405 nm and 436 nm. A 355 nm laser source can also be used. In an embodiment, the radiation can have a wavelength of about 405 nm.

In an embodiment, radiation can be directed from the illumination system at the patterning device 110 at an angle between 0 and 90°, e.g. between 5 and 85°, between 15 and 75°, between 25 and 65°, or between 35 and 55°. The radiation from the illumination system can be provided directly to the patterning device 110 (i.e. without relying on mirror array 140). In an alternative embodiment, radiation can be directed from the illumination system to the patterning device 110 by means of a beam splitter configured such that the radiation is initially reflected by the beam splitter and directed to the patterning device 110. The patterning device 110 can modulate beam 114 and reflect it back to the beam splitter which transmits the modulated beam toward the substrate 160. However, alternative arrangements can be used to direct radiation to the patterning device 110 and subsequently to the substrate 160. In particular, an illumination system arrangement may not be required if a transmissive patterning device 110 (e.g. a LCD array) is used or the patterning device 110 is self-emissive (e.g., laser diodes).

Although lithography apparatus 100 according to an embodiment of the invention is herein described as being for exposing a substrate, lithography apparatus 100 can also be used to expose a resist on a substrate or used to project a patterned beam 114 for use in resistless lithography.

Some embodiments of the disclosed subject matter can implement greyscaling by, for example, controlling the amplitude of light that reaches substrate 160. In particular, specific amplitudes of light can be imaged onto mirror array 140 as part of the greyscaling process. To provide the specific amplitudes required, amplitude plate 120 can be used. As used herein, amplitude plate 120 can include any number (e.g., 1, 7, 8, 16, etc.) of filters or other light attenuating or reducing structures that determine what light amplitude reaches mirror array 140. In an embodiment, light can be transmitted through amplitude plate 120 containing portions that cause the transmitted light to contain a number of light amplitudes. As one example, amplitude plate 120 can include neutral density filters that attenuate light by factors corresponding to first greyscale pattern 126 (e.g., $\frac{1}{256}$, $\frac{1}{128}$, $\frac{1}{64}$, $\frac{1}{32}$, $\frac{1}{16}$, $\frac{1}{8}$, $\frac{1}{4}$, and $\frac{1}{2}$). In an embodiment, the portions can include non-transparent layers having different thicknesses that serve to attenuate the light. The non-transparent layers can be made of, for example, a metal coating or film that is sufficiently thin to block some of the light from light source 112 and form a desired greyscale pattern. In this way, the light amplitudes can correspond to bits in the first greyscale pattern 126. In an embodiment, first greyscale pattern 126 can have a first resolution (e.g. the "low resolution" 8 bit greyscale pattern) and amplitude plate 120 can transmit the light amplitudes to cause a combined exposure at substrate 160 to have a second resolution higher than the first resolution. Specifically, in some embodiments, the second resolution can be 256 greyscale values and amplitude plate 120 can transmit eight light amplitudes to give the first resolution eight greyscale values.

In some embodiments, the same amplitude of the light can be imaged onto mirror array 140 from a single portion of amplitude plate 120 effectively grouping individual mirrors into "low resolution bands" (e.g., 8 "bit" greyscale, 7 bit greyscale, etc.). Accordingly other embodiments, the first greyscale pattern 126 (generated from amplitude plate 120 and delivered to mirror array 140) can have eight light amplitudes or seven light amplitudes. In yet another embodiment, first greyscale pattern 126 can have seven light amplitudes by illuminating eight portions of amplitude plate 120 where three of the eight portions transmit equal light amplitudes. Here, one of the three portions of amplitude plate 126 (e.g., having ¼ of the maximum amplitude from light source 112) acts as one band and the other two ¼ amplitude portions can be combined at substrate 160 to for ½ amplitude exposure.

As used herein, the term "amplitude" or "light amplitude" means an amplitude of the light emitted from light source 112. Further, it is contemplated that the term "amplitude" can also be used to indicate, in some embodiments, an intensity or energy. For example, rather than a greyscale pattern being expressed in terms of ¹⁄₂₅₆, ¹⁄₁₂₈, etc. of a light source amplitude, such may be in terms of power (W) or intensity (W/m$^2$) (e.g., part of intensity plate can transmit ¹⁄₂₅₆ of the intensity of the light source as measured at the intensity plate). Intensity (or "amplitude" as used more generally used herein) can also be expressed in terms of power per unit solid angle without deviating from the scope of the present disclosure.

To address pixels on substrate that need to be exposed, mirror array 140 can be provided that directs beam 114 to the desired position. In an embodiment, beam 114 can be directed by mirror array 140 to spots on substrate 160 that need to be exposed. In an embodiment, mirror array 140 can be configured to deflect beam 114 in both X- and Y-directions to position the spot on a pixel on the substrate. When a portion of beam 114 is not needed, it can be deflected towards a beam dump.

In an embodiment, regions on mirror array 140 can be illuminated with a number of light amplitudes. The regions can correspond to bits of the first greyscale pattern 126.

As discussed above, mirror array 140 can facilitate deflection of beam 114 from light source 112 in the X- and/or Y-direction. In other words, this type of mirror array 140 can point the beam 114 towards a specific location on lens array 154 and thereby to substrate 160. In an embodiment, mirror array 140 can deflect the radiation in only the Y-direction or only the X-direction. In an embodiment, the mirror array 140 can deflect the radiation in both X- and Y-directions.

In an embodiment, mirror array 140 can be a mechanical (i.e., galvanometer-type), an electro-optic, and/or acousto-optic mirror array. A mechanical mirror array tends to provide the largest number of resolvable radiation spots (i.e., a resolvable spot means that the beam is deflected by an angle equal to its own angular spread), but tends to be slowest in terms of spot scan rate. An electro-optic mirror array tends to be the fastest in terms of spot scan rate, but tends to have the smallest number of resolvable radiation spots.

In an embodiment, the mirror array 140 can be an electro-optical mirror array. An electro-optical mirror array can provide a switching speed of up to a few nanoseconds. In an embodiment, the electro-optical mirror array can provide deflection angles of +/−15 degrees. In an embodiment, this can yield about 600 radiation spots for an input beam divergence of 0.05 degrees. In an embodiment, use of an electro-optical mirror array can avoid having a fast moving mechanical part for radiation deflection. In an embodiment, there can be no moving optical elements between the radiation source 112 and the substrate 160.

The electro-optical mirror array can include an optically transparent piezo material. Thus, in an embodiment, beam 114 can be steered due to a potential difference applied over the piezo material. For example, when a potential difference is applied across such an optically transparent material, the index of refraction of the material changes, which changes the direction of beam propagation (i.e., the radiation beam can be deflected). In an embodiment, the material is selected from the following: $LiNbO_3$, $LiTaO_3$, $KH_2PO_4$ (KDP), or $NH_4H_2PO_4$ (ADP). $LiTaO_3$ is transparent at the 405 nm wavelength.

Projection system 150 (e.g., a quartz and/or $CaF_2$ lens system or a catadioptric system comprising lens elements made from such materials, or a mirror system) can be used to project beam 114 onto of substrate 160. Projection system 150 can project a first greyscale pattern provided by light source 112 and mirror array 140 such that the first greyscale pattern is coherently formed on the substrate 160.

In this respect, the projection system can include a focusing element, or a number of focusing elements (herein referred to generically as lens array 154) e.g., a micro-lens array 154 (MLA) or a Fresnel lens array 154, e.g. to form the secondary sources and to image spots onto substrate 160.

In an embodiment, the light can be imaged onto a lens array 154 that includes lenses that focus the light onto substrate 160. In another embodiment, substrate 160 can be illuminated multiple times at a location to cause a total light amplitude delivered to correspond to the second greyscale pattern.

In an embodiment, lens array 154 (e.g., a MLA) can include at least 10 focusing elements, e.g. at least 100 focusing elements, at least 1,000 focusing elements, at least 10,000 focusing elements, at least 100,000 focusing elements, or at least 1,000,000 focusing elements. In some embodiments, the number of lenses in the lens array 154 can be equal to the number or mirrors in mirror array 140.

In an embodiment, the lens array 154 is movable at least in the direction to and away from substrate, e.g. with the use of one or more actuators. Being able to move the lens array 154 to and away from substrate allows, e.g., for focus adjustment without having to move substrate 160. In an embodiment, individual lens element in the lens array 154, for instance each individual lens element in the lens array 154, are movable at least in the direction to and away from the substrate (e.g. for local focus adjustments on non-flat substrates or to bring each optical column into the same focus distance).

Any of the lenses in lens array 154 can focus light onto a spot on substrate. As used herein, "spot" means an area on the substrate where the light from one or more lenses reaches substrate 160. The spot can be, but is not necessarily, a focal point of any particular lens. In some embodiments, a spot can correspond to a waist of a Gaussian beam. A spot may be circular, elliptical, or any other shape as a result of the distance, angle, etc. of the substrate and the beam, the shape of any lenses, beam blocks with shaped apertures, etc.

In an embodiment, a spot size can be 10 microns or less, 5 microns or less, e.g. 3 microns or less, 2 microns or less, 1 micron or less, 0.5 micron or less, 0.3 micron or less, or about 0.1 micron. In an embodiment, spot size on the substrate is 0.1 micron or more, 0.2 micron or more, 0.3 micron or more, 0.5 micron or more, 0.7 micron or more, 1 micron or more, 1.5 microns or more, 2 microns or more, or 5 microns or more. In an embodiment, a spot size is about 0.1 micron. In an embodiment, a spot size is about 0.5 micron. In an embodiment, a spot size is about 1 micron. Such sizes can be applied to a diameter, major or semi-major axis, or other relevant dimension of the spot.

In some embodiments, the lithographic apparatus can include a controller that generates signals to set the patterning device to the requisite state at each stage during the exposure process. The pattern to be formed on the substrate can be provided to the lithographic apparatus in a vector-defined format e.g., GDSII. In order to convert the design information into the control signals, the controller can include one or more data manipulation devices that can be configured to perform a processing step on a data stream that represents the pattern. The data manipulation devices can collectively be referred to as the "datapath".

The data manipulation devices of the datapath can be configured to perform one or more of the following functions: converting vector-based design information into bit-map pattern data; converting bitmap pattern data into a required radiation dose map (namely a required radiation dose profile across the substrate); converting a required radiation dose map into required radiation amplitude values for each light source; and converting the required radiation amplitude values for each light source into corresponding control signals.

In an embodiment, the control signals can be supplied to the light sources 112 and/or one or more other devices (e.g., a mirror array and/or sensor) by wired or wireless communication. Further, signals from the light sources 112 and/or from one or more other devices (e.g., a mirror array and/or sensor) can be communicated to the controller. In a similar manner to the control signals, power can be supplied to the light sources 112 or one or more other devices (e.g., a mirror array and/or sensor) by wired or wireless means. For example, in a wired embodiment, power can be supplied by one or more lines, whether the same as the ones that carry the signals or different. A sliding contact arrangement can be provided to transmit power. In a wireless embodiment, power can be delivered by RF coupling.

While the previous discussion focused on the control signals supplied to the light sources 112 and/or one or more other devices (e.g., a mirror array and/or a sensor), they should be understood to encompass in addition or alternatively, through appropriate configuration, transmission of signals from the light sources 112 and/or from one or more other devices (e.g., a mirror array and/or sensor) to the controller. So, communication can be one-way (e.g., only to or from the light sources 112 and/or one or more other devices (e.g., a mirror array and/or sensor)) or two-way (i.e., from and to the light sources 112 and/or one or more other devices (e.g., a mirror array and/or sensor)).

In an embodiment, the control signals to provide the pattern can be altered to account for factors that can influence the proper supply and/or realization of the pattern on the substrate. For example, a correction can be applied to the control signals to account for the heating of one or more of the light sources 112, lenses, etc. Such heating can cause changed pointing direction of the light sources 112, lenses, etc., change in uniformity of the radiation, etc. In an embodiment, a measured temperature and/or expansion/contraction associated with light sources 112 and/or other element from, e.g., a sensor can used to alter the control signals that would have been otherwise provided to form the pattern. So, for example, during exposure, the temperature of the light sources 112 can vary, the variance causing a change of the projected pattern that would be provided at a single constant temperature. Accordingly, the control signals can be altered to account for such variance. Similarly, in an embodiment, results from the alignment sensor and/or the level sensor 150 can be used to alter the pattern provided by the light sources 112. The pattern can be altered to correct, for example, distortion, which can arise from, e.g., optics (if any) between the light sources 112 and the substrate 160, irregularities in the positioning of the substrate 160, unevenness of the substrate 160, etc.

With the aid of a positioning device (and optionally a position sensor on a base (e.g., an interferometric measuring device that receives an interferometric beam, a linear encoder or a capacitive sensor)), substrate 160 can be moved accurately, e.g., so as to position different target portions in the path of beam 114. In other embodiments, a positioning device for light sources 112 can be used to accurately correct the position of light sources 112 with respect to the path of beam 114, e.g., during a scan.

Figure 2:
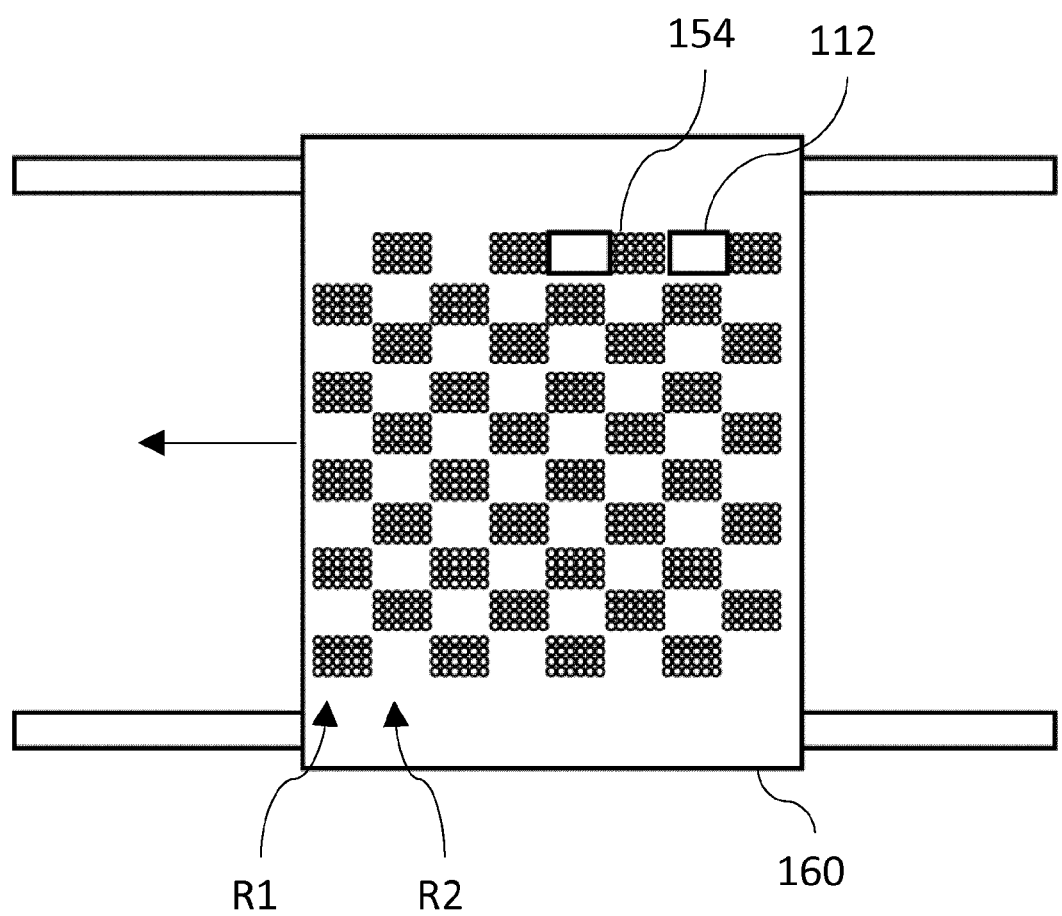
FIG. 2 is a simplified diagram illustrating an exemplary substrate and exposure pattern, according to an embodiment.

FIG. 2 is a simplified diagram illustrating an exemplary substrate and exposure pattern, according to an embodiment. Lithographic apparatus 100, in an embodiment, can include light sources 112 arranged on a frame or other supporting structure.

In an embodiment, light source 112 can be positioned adjacent to mirror array 140 to form part of a staggered pattern of alternating light sources and mirror arrays. In another embodiment, light source can be positioned adjacent to lens array 154 to form part of a staggered pattern of alternating light sources and lens arrays 154.

As shown in FIG. 2, the light sources 112 can be arranged into a number (e.g., at least 8) of stationary separate arrays of light sources 112 extending along the Y-direction. Further, in an embodiment, a number of the arrays of light sources 112 can be staggered in the X-direction from adjacent array of light sources 112 in an alternating fashion. The lithographic apparatus 100, particularly the light sources 112, can be arranged to provide pixel-grid imaging (described below). Lens arrays 154 can be staggered in a similar manner as light sources 112. In this way, light sources 112 and lens arrays 154 can, at least in a projection as shown in FIG. 2, fill in a substantial portion of an imaging region, such as could be used with an assembly line or other processing apparatus. It is understood that light sources 112 and lens arrays 154 need not be coplanar. The example in FIG. 2 illustrates, in general, that various components of lithographic apparatus 100 can be positioned in a staggered configuration to, for example, minimize the required area for patterning.

An entire substrate 160 can be exposed in a single scan by using a plurality of lithographic apparatuses 100, with each lithographic apparatus 100 comprising one or more light sources 112. Arrays of radiation spots can be produced by multiple lithographic apparatuses 100, arranged in at least two rows (e.g., R1, R2) in a 'chess board' or staggered configuration such that the edge of one array of radiation spots slightly overlaps with the edge of the adjacent array of radiation spots. In an embodiment, the lithographic apparatuses 100 (which may correspond to one or more groups of light sources 112 and/or lens arrays 154) are arranged in at least 3 rows, for instance 4 rows or 5 rows. In this way, a band of radiation extends across the width of substrate 160, allowing exposure of the entire substrate to be performed in a single scan. Such "full width" single pass exposure helps to avoid possible stitching issues of connecting two or more passes and can also reduce machine footprint as the substrate need not be moved in a direction transverse to the substrate pass direction. It will be appreciated that any suitable number of lithographic apparatuses 100 can be used. In an embodiment, the number of lithographic apparatuses 100 is at least 1, for instance at least 2, at least 4, at least 8, at least 10, at least 12, at least 14, or at least 17. In an embodiment, the number of lithographic apparatuses 100 is less than 40, e.g. less than 30 or less than 20. Each lithographic apparatus 100 can comprise a separate patterning device 110 and optionally a separate projection system 150 and/or radiation system as described above. It is to be appreciated, however, that two or more lithographic apparatuses 100 can share at least a part of one or more of the radiation system, patterning device 110, and/or projection system 150.

Substrate 160 can be scanned (or exposed) in a pulse mode. In pulse mode, the light sources 112 are kept essentially stationary and the entire pattern is projected onto a target portion of the substrate 160 using pulsing (e.g., provided by a pulsed radiation source or by pulsing the light sources). The substrate 160 is moved with an essentially constant speed such that the beam 114 is caused to scan a line across the substrate 160. The pattern provided by the light sources is updated as required between pulses and the pulses are timed such that successive target portions are exposed at the required locations on the substrate 160. Consequently, beam 114 can scan across the substrate 160 to expose the complete pattern for a strip of the substrate 160. The process is repeated until the complete substrate 160 has been exposed line by line.

Figure 3:
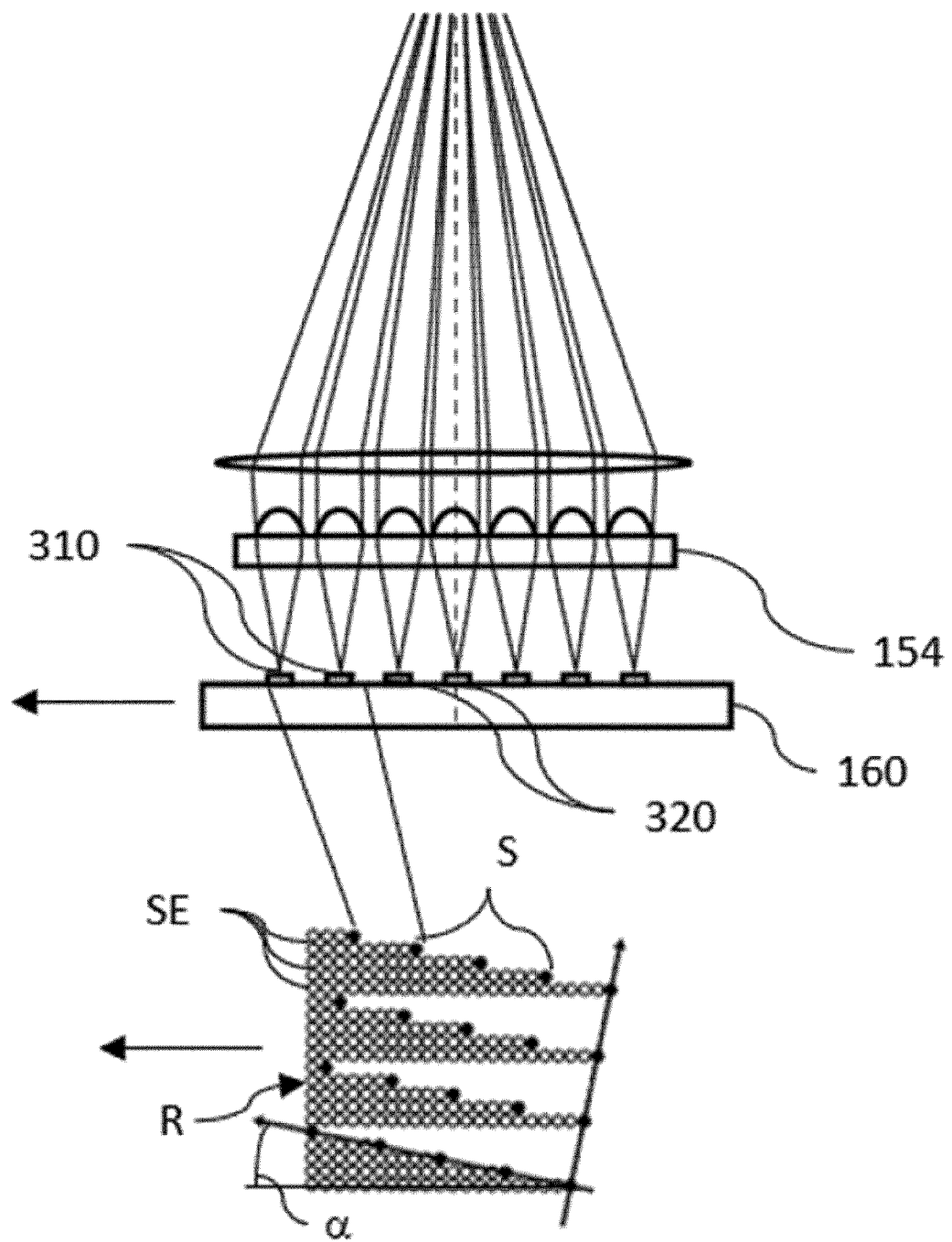
FIG. 3 is a simplified diagram illustrating pixel-grid imaging at the substrate, according to an embodiment.

FIG. 3 is a simplified diagram illustrating pixel-grid imaging at substrate 160, according to an embodiment. In an embodiment, the lithographic apparatus 100 can project the radiation of the light sources 112 onto the substrate in a manner that does not form individual pixels for projection onto the substrate but rather a substantially continuous image for projection onto the substrate. The lithographic apparatus 100, particularly the light sources 112, can be arranged to provide pixel-grid imaging as described in more detail herein. In another embodiment, lithographic apparatus 100 need not provide pixel-grid imaging. In yet another embodiment, a lens array 154 can be positioned at an angle relative to a scan direction of substrate 160 such that spots from lens array 154 are substantially abutting to create a substantially continuous row of spots at substrate 160.

FIG. 3 illustrates schematically how the pattern on substrate 160 can be generated. The filled in circles represent the array of spots S projected onto substrate 160 by lens array 154 in projection system 150. Substrate 160 is moved relative to projection system 150 in the X-direction as a series of exposures are exposed on the substrate. The open circles represent spot exposures SE that may have previously been exposed on substrate 160. As shown, each spot projected onto substrate 160 by lens array 154 within projection system 150 exposes a row R of spot exposures on substrate 160. The complete pattern for the substrate 160 is generated by the sum of all the rows R of spot exposures SE exposed by each of spots S. Such an arrangement can be referred to as "pixel grid imaging." It will be appreciated that FIG. 3 is a schematic drawing and that spots S can overlap in practice, for example as illustrated later with reference to FIGS. 4 and 5.

It can be seen that the array of radiation spots S can be arranged at an angle α relative to the substrate scanning direction (the edges of the substrate 160 lie parallel to the X- and Y-directions). This is done so that, when substrate 160 is moved in the scanning direction (the X-direction), each radiation spot will pass over a different area of the substrate, thereby allowing the entire substrate to be covered by the array of radiation spots S. In various embodiments, the angle α can be less than one of 20°, 10°, 5°, 3°, 1°, 0.5°, 0.25°, 0.10°, 0.05°, or 0.01°. In an embodiment, the angle α is at least 0.0001°, e.g. at least 0.001°. The angle of inclination a and the width of the array in the scanning direction are determined in accordance with the image spot size and array spacing in the direction perpendicular to the scanning direction to ensure the whole surface area of the substrate 160 is addressed.

In the context of the present disclosure, it is important to note that in certain embodiments, some of spots S can have the same amplitude of light. For example, FIG. 3 shows example spots 310 that can have the same amplitude of light (as imaged from amplitude plate 120). Amplitude plate 120 can provide the same amplitude of light to some places on mirror array 140 and/or lens array 154. By providing the lower resolution light to many spots at once, and using repeated exposures to provide the higher resolution total exposure needed for the manufacturing process, throughput of lithography system 100 can be greatly increased.

In photolithography, a desired feature can be, for example, created on a substrate by selectively exposing a layer of resist on a substrate to radiation. Areas of the resist receiving a certain minimum radiation dose ("dose threshold") undergo a chemical reaction, whereas other areas remain unchanged. The thus created chemical differences in the resist layer allow for developing the resist, i.e. selectively removing either the areas having received at least the minimum dose or removing the areas that did not receive the minimum dose. As a result, part of the substrate is still protected by a resist whereas the areas of the substrate from which resist is removed are exposed, allowing e.g. for additional processing steps, for instance selective etching of the substrate, selective metal deposition, etc. thereby creating the desired feature. Patterning the radiation can be effected by controlling patterning device 110 such that the radiation that is transmitted to an area of the resist layer on the substrate within the desired feature is at a sufficiently high amplitude that the area receives a dose of radiation above the dose threshold during the exposure, whereas other areas on the substrate receive a radiation dose below the dose threshold by providing a zero or significantly lower radiation amplitude.

In practice, the radiation dose at the edges of the desired feature does not abruptly change from a given maximum dose to zero dose even if set to provide the maximum radiation amplitude on one side of the feature boundary and the minimum radiation amplitude on the other side. Instead, due to diffractive effects, the level of the radiation dose can drop off across a transition zone. The position of the boundary of the desired feature ultimately formed after developing the resist is then determined by the position at which the received dose drops below the radiation dose threshold. The profile of the drop-off of radiation dose across the transition zone, and hence the precise position of the feature boundary, can be controlled more precisely by providing radiation to points on the substrate that are on or near the feature boundary not only to maximum or minimum amplitude levels but also to amplitude levels between the maximum and minimum amplitude levels. This is commonly referred to as "greyscaling" or "greyleveling."

Greyscaling can provide greater control of the position of the feature boundaries than is possible in a lithography system in which the radiation amplitude provided to the substrate can only be set to two values (namely just a maximum value and a minimum value). In an embodiment, at least three different radiation amplitude values can be projected, e.g. at least 4 radiation amplitude values, at least 8 radiation amplitude values, at least 16 radiation amplitude values, at least 32 radiation amplitude values, at least 64 radiation amplitude values, at least 100 radiation amplitude values, at least 128 radiation amplitude values, or at least 256 radiation amplitude values. If the patterning device is a radiation source itself (e.g. an array of light emitting diodes or laser diodes), greyscaling can be effected, e.g., by controlling the amplitude levels of the radiation being transmitted. If the patterning device include mirror array 140, greyscaling can be effected, e.g., by controlling the tilting angles of mirror array 140. Also, greyscaling can be effected by grouping a plurality of programmable elements and/or mirror array and controlling the number of elements and/or mirror array within the group that are switched on or off at a given time.

In one example, the patterning device (comprising one or more lithography devices providing a sequence of one or more exposures of a substrate) can have a series of states including: (a) a black state in which radiation provided is a minimum, or even a zero contribution to the amplitude distribution of its corresponding pixel; (b) a whitest state in which the radiation provided makes a maximum contribution; and (c) a plurality of states in between in which the radiation provided makes intermediate contributions. The entire plurality of states could be described as a sequence of grey states, between black and white, selectable to enable greyscale printing.

Figure 4:
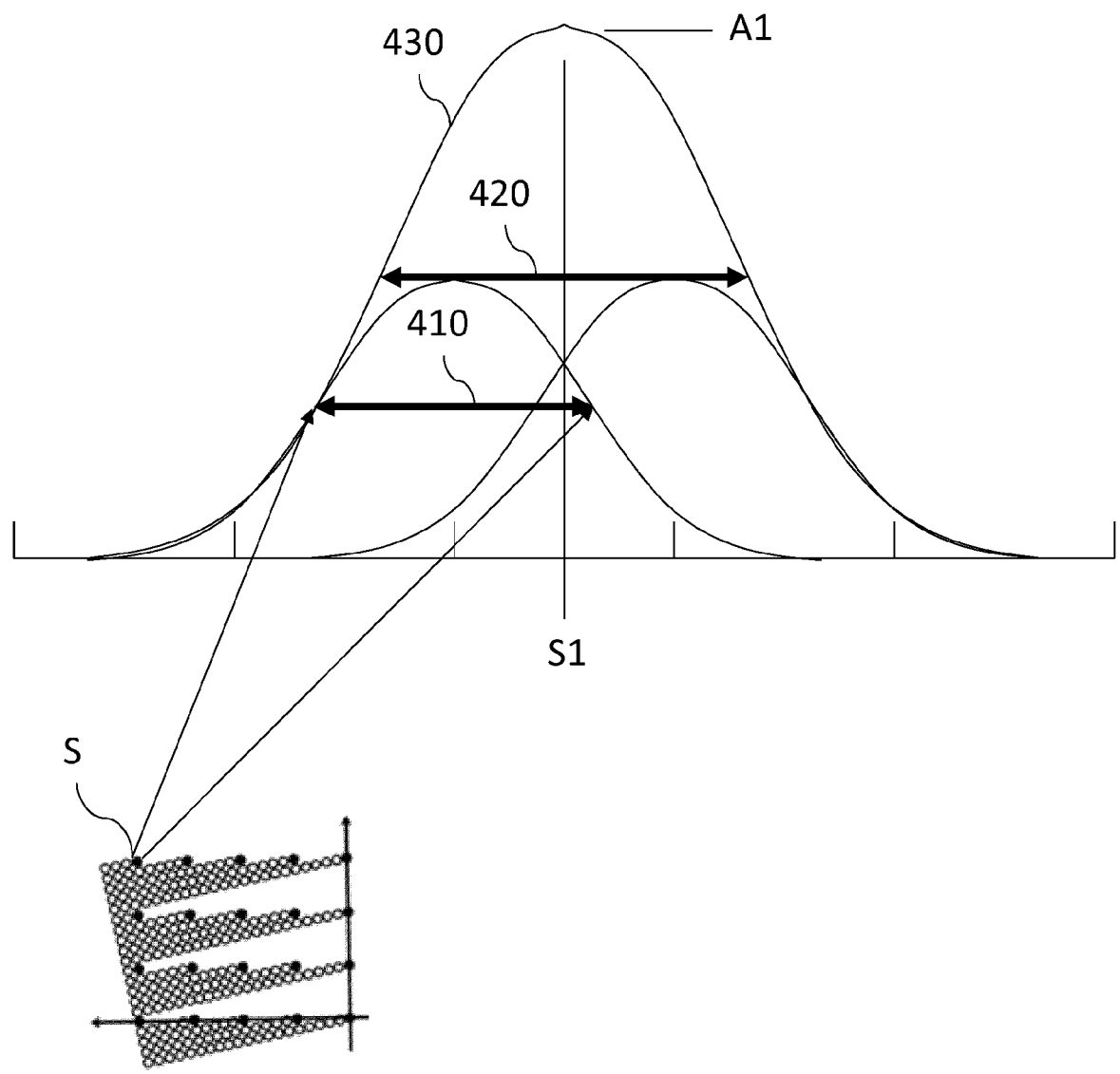
FIG. 4 is a simplified diagram illustrating a critical dimension formed by the superimposing of two Gaussian light beams, according to an embodiment.

FIG. 4 is a simplified diagram illustrating a critical dimension formed by the superimposing of two Gaussian light beams, according to an embodiment.

In some lithography processes, light can be combined to provide a specific amount of illumination with a specific dimension at a substrate. For example, photoresist or other such substrate can be exposed to light in such a way that the light pattern forms features having specific dimensions. Such dimensions can include critical dimensions (CD) that characterize a feature of the photoresist or desired feature of the substrate. Light can be generated such that the critical dimension (or merely an "edge" of a light beam) corresponds to a characteristic width of the light spot.

In an embodiment, light from light source 112 can be a Gaussian light beam that can be imaged onto spot S at substrate 160. Spot S can have a spot diameter 410 that corresponds to a width of a profile of the Gaussian light beam. Spot diameter 410 can also be considered the resolution of the resulting aerial image, and can represent, in some cases, the smallest feature that can be created at substrate 160.

In another embodiment, during a scan of substrate 160 by a lithography system, a number of exposures of the light can be delivered to form a light feature 430 (which may correspond to a portion of an aerial image). As used herein, "light feature" refers to the light at the substrate, whereas "printed features" refer to a resulting physical feature or change that may result from the light feature delivered during a lithography process. Light feature 430 can have a light feature size 420 and a light feature placement S1 at the substrate. The light feature size 420 can be based on the summation of amplitude profiles delivered during the exposures. One example is shown in FIG. 4, where light feature 430 is formed by the summed exposures (which may happen at different times during a scan) of adjacent spots.

While in one sense the location of an edge of light feature 430 on substrate 160 can be limited by the image placement of spots (e.g., spacing between spots, spot size, etc.) imaged on substrate 160, embodiments of the present disclosure can allow finer adjustment of such edges, as described below.

Figure 5:
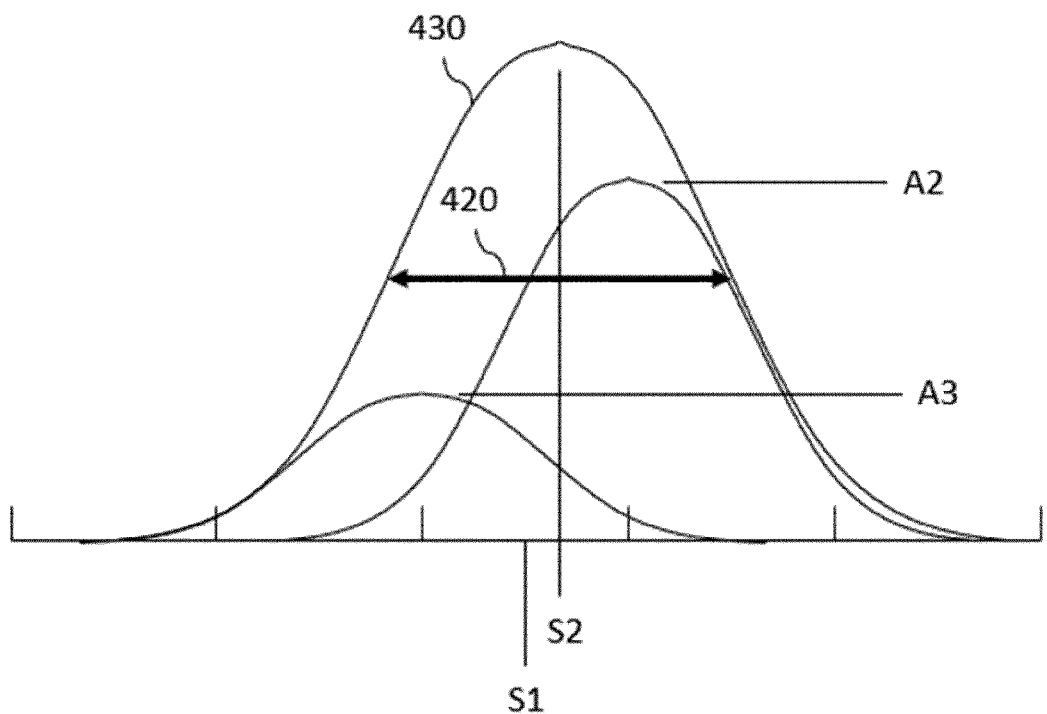
FIG. 5 is a simplified diagram illustrating shifting of the critical dimension, according to an embodiment.

FIG. 5 is a simplified diagram illustrating shifting of the critical dimension, according to an embodiment.

In this example, light feature 430 can be the result of the summation of two adjacent light spots (though any number and arrangement of light spots can be used to form a desired light feature). The light feature width 420 can correspond to a critical dimension, as used in some lithography processes. In yet another embodiment, light feature 430 can be shifted by modifying one or more of light amplitudes in the exposures of light, while maintaining the light feature size 420. In an embodiment, light feature 430 can be formed by the summation of the light amplitudes corresponding to bits of the second greyscale pattern. Specifically, the shifting can be performed by changing the light amplitudes to different bits in the second greyscale pattern. As illustrated in FIG. 5, varying the exposure by changing the formerly two equal amplitudes to two different amplitudes A2 and A3 can cause a fine shift in the location of light feature 430 (from S1 to S2). By changing the exposure at substrate 160 in such a bitwise fashion, fine adjustment of printed features in the patterning process can be achieved. Also, feature size 420 can be driven by the amplitudes A2 and A3. For example, if both A2 and A3 increase or decrease in intensity, the image placement S2 may stay the same while the light image size 410 may correspondingly increase or decrease.

It should be appreciated that greyscaling can be used for additional or alternative purposes to that described above. For example, the processing of the substrate after the exposure can be tuned such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, greyscaling can be used to provide a radiation dose profile across the substrate having more than two desired dose levels. In an embodiment, the radiation dose profile has at least 2 desired dose levels, e.g. at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the amplitude of the radiation received at each point, as described above. For example, the radiation dose received by each point can alternatively or additionally be controlled by controlling the duration of the exposure of said point. As a further example, each point can potentially receive radiation in a plurality of successive exposures. The radiation dose received by each point can, therefore, be alternatively or additionally controlled by exposing said point using a selected subset of said plurality of successive exposures.

Further, while the discussion above regarding greyscaling focused on photolithography, similar concepts can be applied to the material removal and material deposition discussed herein. For example, ablation can be controlled with different dose levels to provide greyscaling. Similarly, dose levels can be controlled to provide greyscaling associated with the material deposition.

Figure 6:
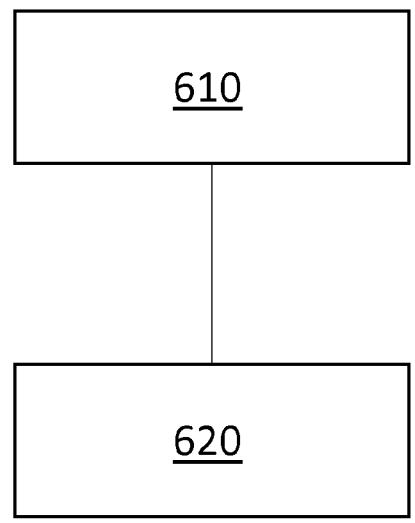
FIG. 6 is a process flow diagram illustrating a maskless lithography method, according to an embodiment.

FIG. 6 is a process flow diagram illustrating a maskless lithography method, according to an embodiment.

In an embodiment, a method of performing maskless lithography can include, at 610, illuminating mirror array 140 with light having a number of light amplitudes forming first greyscale pattern 126. Mirror array 140 can include a number of mirrors and at least two of the mirrors can be illuminated with a same amplitude of the light. At 620, the light having the number of light amplitudes can be imaged onto substrate 160 to create a second greyscale pattern at substrate 160.

Figure 7:
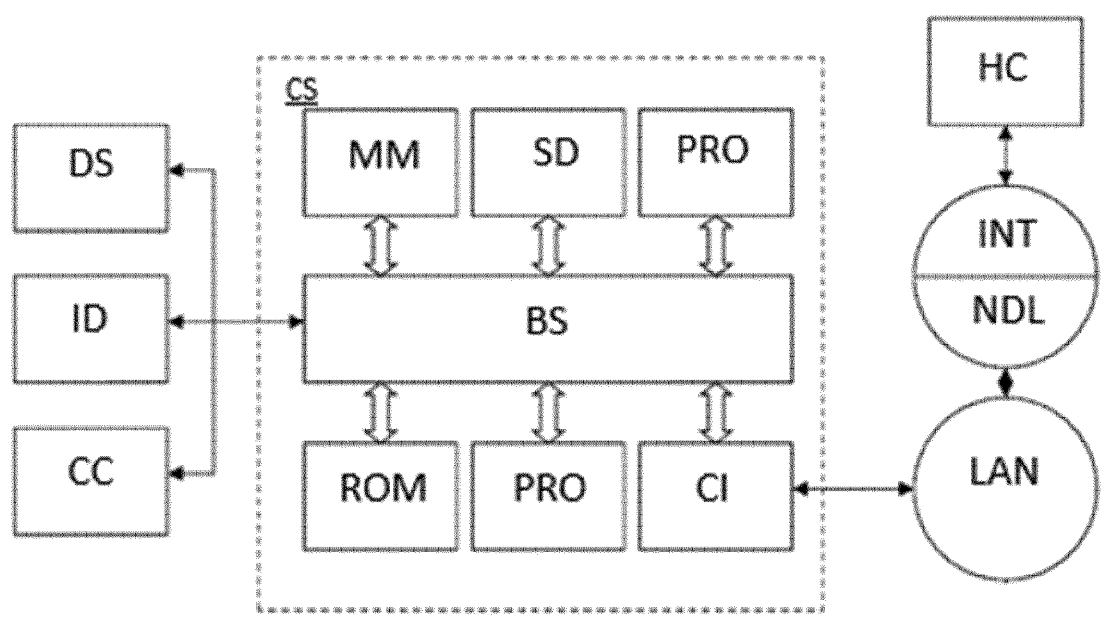
FIG. 7 is a block diagram of an example computer system, according to an embodiment.

FIG. 7 is a block diagram of an example computer system CS, according to an embodiment.

Computer system CS includes a bus BS or other communication mechanism for communicating information, and a processor PRO (or multiple processors) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions to be executed by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 8:
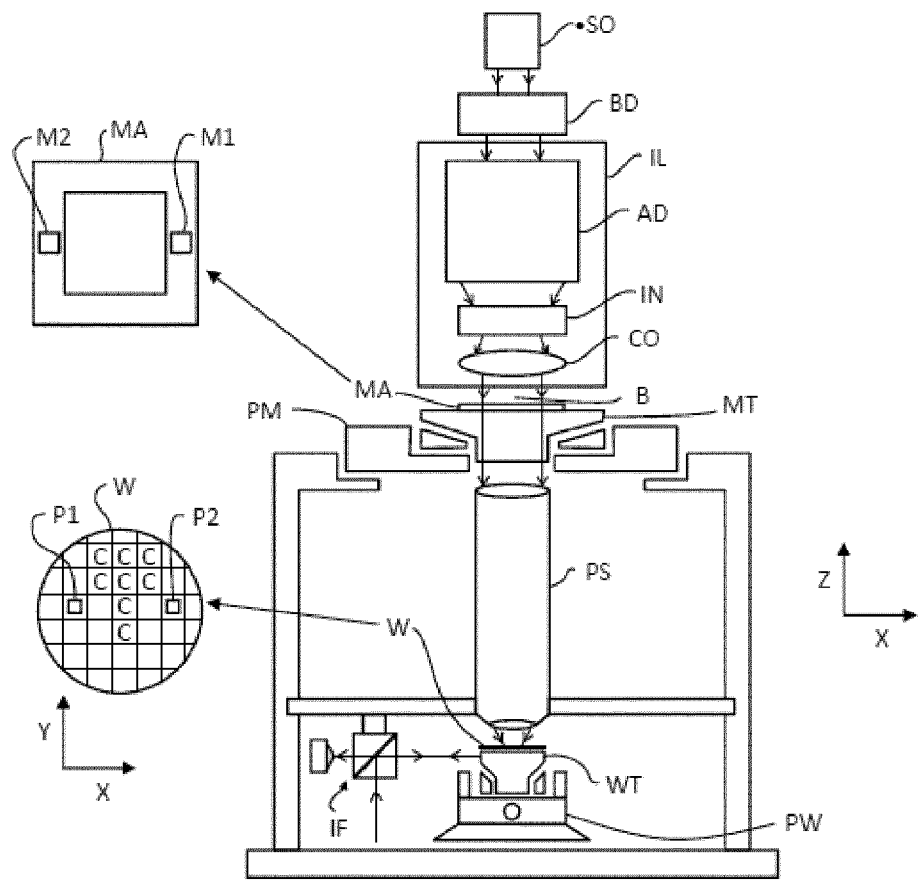
FIG. 8 is a schematic diagram of a lithographic projection apparatus, according to an embodiment.

FIG. 8 is a schematic diagram of a lithographic projection apparatus, according to an embodiment.

The lithographic projection apparatus can include an illumination system IL, a first object table MT, a second object table WT, and a projection system PS.

Illumination system IL, can condition a beam B of radiation. In this particular case, the illumination system also comprises a radiation source SO.

First object table (e.g., patterning device table) MT can be provided with a patterning device holder to hold a patterning device MA (e.g., a reticle), and connected to a first positioner to accurately position the patterning device with respect to item PS.

Second object table (substrate table) WT can be provided with a substrate holder to hold a substrate W (e.g., a resist-coated silicon wafer), and connected to a second positioner to accurately position the substrate with respect to item PS.

Projection system ("lens") PS (e.g., a refractive, catoptric or catadioptric optical system) can image an irradiated portion of the patterning device MA onto a target portion C (e.g., comprising one or more dies) of the substrate W.

As depicted herein, the apparatus can be of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning apparatuses, such as a beam expander Ex, for example. The illuminator IL may comprise adjusting device AD for setting the outer and/or inner radial extent (commonly referred to as σ-outer and σ-inner, respectively) of the amplitude distribution in the beam. In addition, it will generally comprise various other components, such as an integrator IN and a condenser CO. In this way, the beam B impinging on the patterning device MA has a desired uniformity and amplitude distribution in its cross-section.

In some embodiments, source SO may be within the housing of the lithographic projection apparatus (as is often the case when source SO is a mercury lamp, for example), but that it may also be remote from the lithographic projection apparatus, the radiation beam that it produces being led into the apparatus (e.g., with the aid of suitable directing mirrors); this latter scenario can be the case when source SO is an excimer laser (e.g., based on KrF, ArF or F2 lasing).

The beam PB can subsequently intercept patterning device MA, which is held on a patterning device table MT. Having traversed patterning device MA, the beam B can pass through the lens PL, which focuses beam B onto target portion C of substrate W. With the aid of the second positioning apparatus (and interferometric measuring apparatus IF), the substrate table WT can be moved accurately, e.g. so as to position different target portions C in the path of beam PB. Similarly, the first positioning apparatus can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool) patterning device table MT may just be connected to a short stroke actuator, or may be fixed.

The depicted tool can be used in two different modes, step mode and scan mode. In step mode, patterning device table MT is kept essentially stationary, and an entire patterning device image is projected in one go (i.e., a single "flash") onto a target portion C. Substrate table WT can be shifted in the x and/or y directions so that a different target portion C can be irradiated by beam PB.

In scan mode, essentially the same scenario applies, except that a given target portion C is not exposed in a single "flash." Instead, patterning device table MT is movable in a given direction (the so-called "scan direction", e.g., the y direction) with a speed v, so that projection beam B is caused to scan over a patterning device image; concurrently, substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 9:
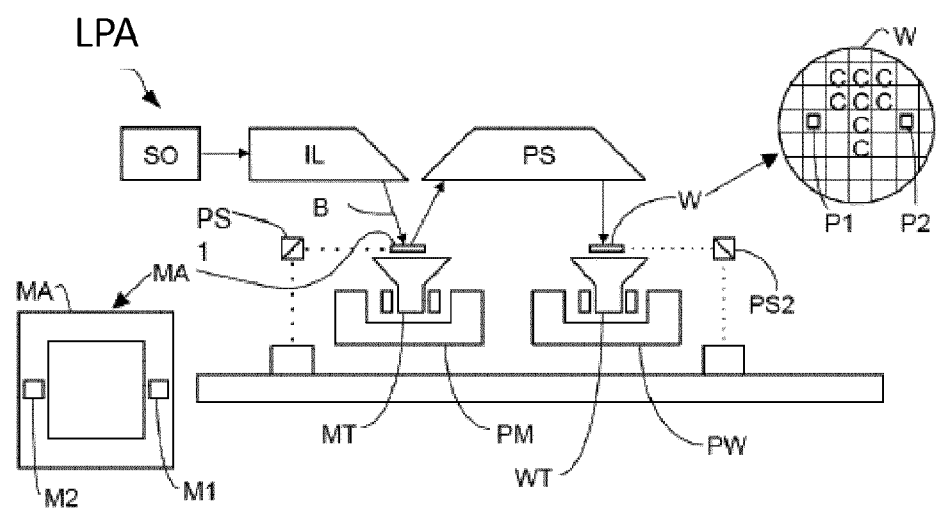
FIG. 9 is a schematic diagram of another lithographic projection apparatus, according to an embodiment.

FIG. 9 is a schematic diagram of another lithographic projection apparatus (LPA), according to an embodiment.

LPA can include source collector module SO, illumination system (illuminator) IL configured to condition a radiation beam B (e.g. EUV radiation), support structure MT, substrate table WT, and projection system PS.

Support structure (e.g. a patterning device table) MT can be constructed to support a patterning device (e.g. a mask or a reticle) MA and connected to a first positioner PM configured to accurately position the patterning device;

Substrate table (e.g. a wafer table) WT can be constructed to hold a substrate (e.g. a resist coated wafer) W and connected to a second positioner PW configured to accurately position the substrate.

Projection system (e.g. a reflective projection system) PS can be configured to project a pattern imparted to the radiation beam B by patterning device MA onto a target portion C (e.g. comprising one or more dies) of the substrate W.

As here depicted, LPA can be of a reflective type (e.g. employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. Source collector module SO may be part of an EUV radiation system including a laser for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser may not be considered to form part of the lithographic apparatus and the radiation beam can be passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source.

Illuminator IL may comprise an adjuster for adjusting the angular amplitude distribution of the radiation beam. Generally, at least the outer and/or inner radial extent (commonly referred to as σ-outer and σ-inner, respectively) of the amplitude distribution in a pupil plane of the illuminator can be adjusted. In addition, the illuminator IL may comprise various other components, such as facetted field and pupil mirror devices. The illuminator may be used to condition the radiation beam, to have a desired uniformity and amplitude distribution in its cross section.

The radiation beam B can be incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LPA could be used in at least one of the following modes, step mode, scan mode, and stationary mode.

In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g. patterning device table) MT and the substrate table WT are scanned synchronously while a pattern imparted to the radiation beam is projected onto target portion C (i.e. a single dynamic exposure). The velocity and direction of substrate table WT relative to the support structure (e.g. patterning device table) MT may be determined by the (de-)magnification and image reversal characteristics of the projection system PS.

In stationary mode, the support structure (e.g. patterning device table) MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 10:
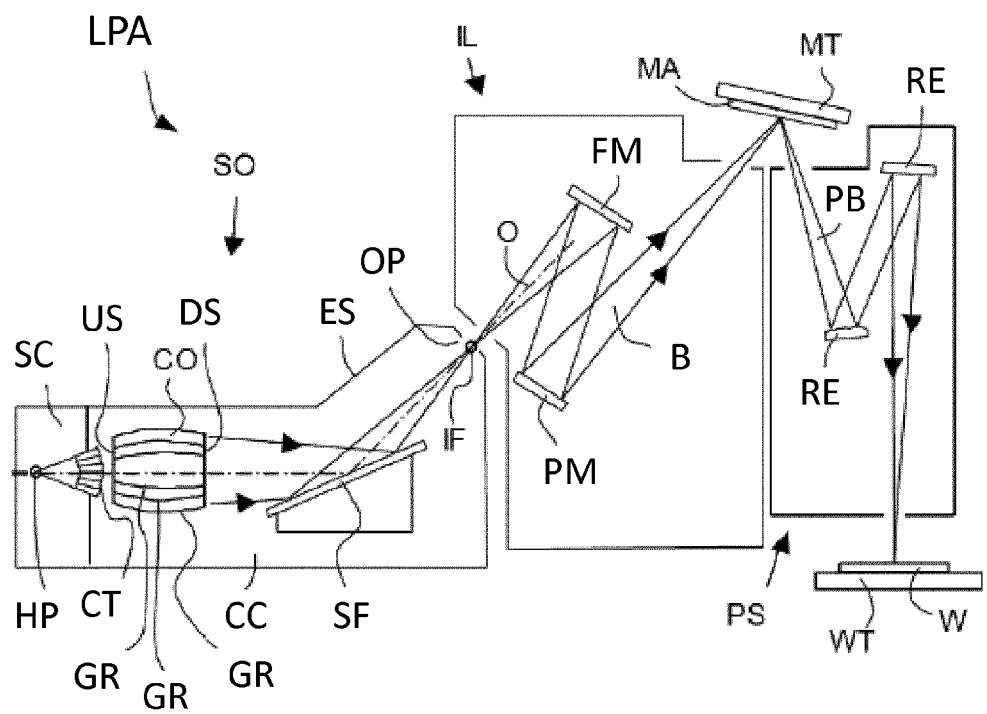
FIG. 10 is a detailed view of the lithographic projection apparatus, according to an embodiment.

FIG. 10 is a detailed view of the lithographic projection apparatus, according to an embodiment.

As shown, LPA can include the source collector module SO, the illumination system IL, and the projection system PS. The source collector module SO is constructed and arranged such that a vacuum environment can be maintained in an enclosing structure ES of the source collector module SO. An EUV radiation emitting hot plasma HP may be formed by a discharge produced plasma source. EUV radiation may be produced by a gas or vapor, for example Xe gas, Li vapor or Sn vapor in which the hot plasma HP is created to emit radiation in the EUV range of the electromagnetic spectrum. The hot plasma HP is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma HP is passed from a source chamber SC into a collector chamber CC via an optional gas barrier or contaminant trap CT (in some cases also referred to as contaminant barrier or foil trap) which is positioned in or behind an opening in source chamber SC. The contaminant trap CT may include a channel structure. Contamination trap CT may also include a gas barrier or a combination of a gas barrier and a channel structure. The contaminant trap or contaminant barrier CT further indicated herein at least includes a channel structure, as known in the art.

The collector chamber CC may include a radiation collector CO which may be a so-called grazing incidence collector. Radiation collector CO has an upstream radiation collector side US and a downstream radiation collector side DS. Radiation that traverses radiation collector CO can be reflected off a grating spectral filter SF to be focused in a virtual source point IF along the optical axis indicated by the dot-dashed line 'O'. The virtual source point IF can be referred to as the intermediate focus, and the source collector module can be arranged such that the intermediate focus IF is located at or near an opening OP in the enclosing structure ES. The virtual source point IF is an image of the radiation emitting plasma HP.

Subsequently the radiation traverses the illumination system IL, which may include a facetted field mirror device FM and a facetted pupil mirror device pm arranged to provide a desired angular distribution of the radiation beam B, at the patterning device MA, as well as a desired uniformity of radiation amplitude at the patterning device MA. Upon reflection of the beam of radiation B at the patterning device MA, held by the support structure MT, a patterned beam PB is formed and the patterned beam PB is imaged by the projection system PS via reflective elements RE onto a substrate W held by the substrate table WT.

More elements than shown may generally be present in illumination optics unit IL and projection system PS. The grating spectral filter SF may optionally be present, depending upon the type of lithographic apparatus. Further, there may be more mirrors present than those shown in the figures, for example there may be 1-6 additional reflective elements present in the projection system PS.

Collector optic CO can be a nested collector with grazing incidence reflectors GR, just as an example of a collector (or collector mirror). The grazing incidence reflectors GR are disposed axially symmetric around the optical axis O and a collector optic CO of this type may be used in combination with a discharge produced plasma source, often called a DPP source.

Figure 11:
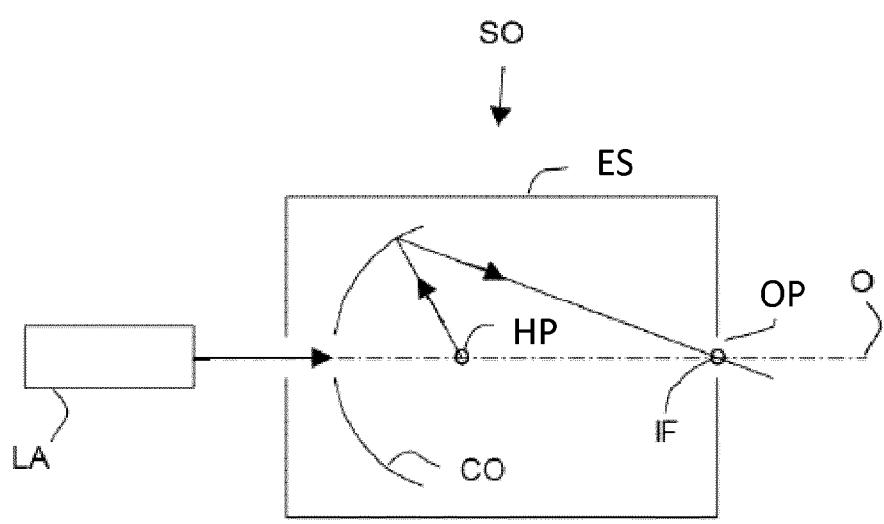
FIG. 11 is a detailed view of the source collector module of the lithographic projection apparatus, according to an embodiment.

FIG. 11 is a detailed view of source collector module SO of lithographic projection apparatus LPA, according to an embodiment.

Source collector module SO may be part of an LPA radiation system. A laser LA can be arranged to deposit laser energy into a fuel, such as xenon (Xe), tin (Sn) or lithium (Li), creating the highly ionized plasma HP with electron temperatures of several 10's of eV. The energetic radiation generated during de-excitation and recombination of these ions is emitted from the plasma, collected by a near normal incidence collector optic CO and focused onto the opening OP in the enclosing structure ES.

The embodiments may further be described using the following clauses:

1. A method of performing maskless lithography, the method comprising:
    illuminating a mirror array with light having a plurality of light amplitudes forming a first greyscale pattern, the mirror array including a plurality of mirrors and at least two of the plurality of mirrors are illuminated with a same amplitude of the light; and imaging the light with the plurality of light amplitudes onto a substrate to create a second greyscale pattern, different than the first greyscale pattern, at the substrate.
2. The method of clause 1, further comprising transmitting the light through an amplitude plate containing a plurality of portions that cause the transmitted light to contain the plurality of light amplitudes.
3. The method of clause 2, wherein the same amplitude of the light is imaged onto the mirror array from a single portion of the amplitude plate.
4. The method of clause 2 wherein the first greyscale pattern has a first resolution and the amplitude plate transmits the plurality of light amplitudes to cause a combined exposure at the substrate to have a second resolution higher than the first resolution.
5. The method of clause 4, wherein the second resolution is 256 greyscale values and the amplitude plate transmits eight light amplitudes to give the first resolution eight greyscale values.
6. The method of clause 1, the illuminating further comprising forming the first greyscale pattern with a plurality of light sources.
7. The method of clause 6, the illuminating further comprising generating one bit of the first greyscale pattern with a light source from the plurality of light sources.
8. The method of clause 7, the illuminating further comprising generating each bit in the first greyscale pattern with a single corresponding light source from the plurality of light sources.
9. The method of any preceding clauses, wherein the plurality of light amplitudes correspond to bits in the first greyscale pattern.
10. The method of any preceding clauses, further comprising generating the first greyscale pattern having eight light amplitudes.
11. The method of any preceding clauses, further comprising generating the first greyscale pattern having seven light amplitudes.
12. The method of clause 11, further comprising generating the first greyscale pattern having seven light amplitudes by illuminating eight portions of an amplitude plate where three of the eight portions transmit equal light amplitudes.
13. The method of clause 1, wherein the light source is configured to uniformly illuminate the mirror array, and wherein first greyscale pattern is generated as a time-varying greyscale pattern.
14. The method of clause 13, wherein a first pulse in the time-varying greyscale pattern represents an amplitude of a most significant bit and a second pulse in the time-varying greyscale pattern represents the amplitude of a next significant bit.
15. The method of any preceding clauses, further comprising toggling the light source on and off with a toggle frequency corresponding to an adjustment frequency of the mirror array.
16. The method of any preceding clauses, further comprising controlling one or more laser diodes to emit the light.
17. The method of any preceding clauses, wherein the light source is positioned adjacent to the mirror array to form part of a staggered pattern of alternating light sources and mirror arrays.
18. The method of any preceding clauses, wherein the light source is positioned adjacent to a lens array to form part of a staggered pattern of alternating light sources and lens arrays.
19. The method of any preceding clauses, illuminating a plurality of regions on the mirror array with the plurality of light amplitudes, the plurality of regions corresponding to bits of the first greyscale pattern.
20. The method of any preceding clauses, further comprising imaging the light onto a lens array that includes a plurality of lenses that focus the light onto the substrate.
21. The method of any preceding clauses, further comprising illuminating the substrate multiple times at a location to cause a total light amplitude delivered to correspond to the second greyscale pattern.
22. The method of any preceding clauses, further comprising positioning a lens array at an angle relative to a scan direction of the substrate such that spots from the lens array are substantially abutting to create a substantially continuous row of spots at the substrate.
23. The method of any preceding clauses, further comprising imaging, from the light, a Gaussian light beam onto a spot at the substrate, wherein the spot has a spot diameter that corresponds to a width of a profile of the Gaussian light beam.
24. The method of clause 23, further comprising delivering, during a scan of the substrate by a lithography system, a plurality of exposures of the light to form a light feature having a light feature size and a light feature placement at the substrate, the light feature size based on the summation of amplitude profiles delivered during the plurality of exposures.

25. The method of clause 24, further comprising shifting the light feature by modifying one or more of the light amplitudes in the plurality of exposures while maintaining the light feature size.

26. The method of clause 25, wherein the light feature is formed by the summation of the light amplitudes corresponding to bits of the second greyscale pattern, and wherein the shifting is performed by changing the one or more of the light amplitudes to different bits in the second greyscale pattern.

27. A computer program product comprising a non-transitory computer readable medium having instructions recorded thereon, the instructions when executed by a computer implementing the method of any of the above clauses.

28. A maskless lithography system comprising:
an amplitude plate that transmits light received from a light source, the amplitude plate comprising a plurality of portions that cause the transmitted light to contain a plurality of light amplitudes; and
a mirror array configured to direct the transmitted light to a substrate.

29. The system of clause 28, further comprising a lens array that focuses the light onto a plurality of spots on the substrate.

30. The system of clause 29, wherein the lens array is a micro-lens array.

31. The system of any of clauses 28 to 30, further comprising a light source that illuminates the amplitude plate.

32. The system of clause 31, wherein the light source uniformly illuminates the amplitude plate.

33. The system of any of clauses 28 to 32, wherein the mirror array is a digital mirror device.

34. A maskless lithography system comprising:
a plurality of light sources configured to generate light having a plurality of light amplitudes that form a first greyscale pattern; and
a mirror array configured to direct the light having the first greyscale pattern to a substrate.

35. The system of clause 34, wherein the mirror array is a digital mirror device.

36. The system of clause 34 or 35, wherein each of the plurality of light sources correspond to one bit in
the first greyscale pattern.

37. A maskless lithography system comprising:
a light source constructed and configured to illuminate a first greyscale pattern on a mirror array, the first greyscale pattern being constituted of a time-varying greyscale pattern, each light pulse at the time-varying greyscale pattern substantially uniformly illuminating the mirror array; and
the mirror array configured to direct the transmitted light to a substrate.

38. The maskless lithography system of clause 37, wherein a first pulse in the time-varying greyscale pattern represents an amplitude of a most significant bit and a second pulse in the time-varying greyscale pattern represents the amplitude of a next significant bit.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-50 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:

1. A maskless lithography system comprising:
a light source constructed and configured to generate a plurality of light amplitudes on a same mirror array such that at least two adjacent mirrors of a plurality of mirrors of the mirror array are illuminated with different amplitudes, the light amplitudes configured to form a first greyscale pattern; and
the mirror array configured to direct the light having the first greyscale pattern to form a greyscale pattern emitting immediately from the mirror array to a substrate to generate a second greyscale pattern, different from the first greyscale pattern, wherein radiation emitted from the mirror array with one of the plurality of different amplitudes does not overlap, or at most partially overlaps, at the substrate radiation emitted from the mirror array with another one of the plurality of different amplitudes.

2. The system of claim 1, wherein the light source further comprises an amplitude plate configured to form the first grey scale pattern.

3. The system of claim 2, wherein the light source uniformly illuminates the amplitude plate.

4. The system of claim 1, wherein the light source comprises a plurality of light sources configured to generate light having a plurality of light amplitudes to form the first greyscale pattern.

5. The system of claim 4, wherein each of the plurality of light sources correspond to one bit in the first greyscale pattern.

6. The system of claim 1, wherein the light source is configured to illuminate at least two of the plurality of mirrors with a same amplitude of light.

7. The system of claim 1, further comprising a lens array configured to focus the light onto a plurality of spots on the substrate.

8. The system of claim 1, wherein the mirror array is a digital mirror device.

9. The system of claim 1, wherein the light source is configured to generate the first greyscale pattern at a first resolution, and the mirror array is configured to reflect the plurality of light amplitudes to cause a combined exposure at the substrate to have a second resolution higher than the first resolution.

10. The system of claim 9, wherein the second resolution is 256 greyscale values, and wherein the light source is configured to generate eight different light amplitudes to generate the first resolution having eight greyscale values.

11. The system of claim 1, wherein the mirror array is configured to direct the light to provide for pixel-grid imaging.

12. A method of performing maskless lithography, the method comprising:
 illuminating a same mirror array with light having a plurality of light amplitudes forming a first greyscale pattern, the mirror array including a plurality of mirrors and at least two adjacent mirrors of the plurality of mirrors are illuminated with different amplitudes of the light to form a greyscale pattern emitting immediately from the mirror array; and
 imaging the light with the plurality of light amplitudes onto a substrate to create a second greyscale pattern, different than the first greyscale pattern, at the substrate,
 wherein radiation emitted from the mirror array with one of the plurality of different amplitudes does not overlap, or at most partially overlaps, at the substrate radiation emitted from the mirror array with another one of the plurality of different amplitudes.

13. The method of claim 12, wherein the illuminating the mirror array comprises illuminating a plurality of regions on the mirror array with the plurality of light amplitudes, the plurality of regions corresponding to bits of the first greyscale pattern, and wherein the method further comprises illuminating the substrate multiple times at a location to cause a total light amplitude delivered to correspond to the second greyscale pattern.

14. The method of claim 12, wherein the mirror array directs the light to provide for pixel-grid imaging.

15. A computer program product comprising a non-transitory computer readable medium having instructions therein, the instructions, when executed by a computer system, configured to cause the computer system to at least:
 cause illumination of a same mirror array with light having a plurality of light amplitudes forming a first greyscale pattern, the mirror array including a plurality of mirrors and at least two adjacent mirrors of the plurality of mirrors are illuminated with different amplitudes of the light to form a greyscale pattern emitting immediately from the mirror array, wherein the light with the plurality of light amplitudes is imaged onto a substrate to create a second greyscale pattern, different than the first greyscale pattern, at the substrate, wherein radiation emitted from the mirror array with one of the plurality of different amplitudes does not overlap, or at most partially overlaps, at the substrate radiation emitted from the mirror array with another one of the plurality of different amplitudes.

16. The computer program product of claim 15, wherein the instructions configured to cause illumination of the mirror array are further configured to cause illumination of a plurality of regions on the mirror array with the plurality of light amplitudes, the plurality of regions corresponding to bits of the first greyscale pattern, and the instructions are further configured cause illuminating the substrate multiple times at a location to cause a total light amplitude delivered to correspond to the second greyscale pattern.

17. The computer program product of claim 15, wherein illumination is produced by a plurality of light sources configured to generate light having a plurality of light amplitudes to form the first greyscale pattern.

18. The computer program product of claim 15, wherein the first greyscale pattern is at a first resolution, and the mirror array is configured to reflect the plurality of light amplitudes to cause a combined exposure at the substrate to have a second resolution higher than the first resolution.

19. The computer program product of claim 18, wherein the second resolution is 256 greyscale values, and wherein the illumination has eight different light amplitudes to generate the first resolution having eight greyscale values.

20. The computer program product of claim 15, wherein the mirror array is configured to direct the light to provide for pixel-grid imaging.

* * * * *